United States Patent
Allan et al.

(10) Patent No.: US 6,543,254 B2
(45) Date of Patent: Apr. 8, 2003

(54) METHOD FOR DETERMINING LASER-INDUCED COMPACTION IN FUSED SILICA

(75) Inventors: Douglas C. Allan, Corning, NY (US); Nicholas F. Borrelli, Elmira, NY (US); William R. Powell, Elmira, NY (US); Thomas P. Seward, III, Alfred, NY (US); Charlene M. Smith, Corning, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 09/964,987

(22) Filed: Sep. 26, 2001

(65) Prior Publication Data

US 2002/0036188 A1 Mar. 28, 2002

Related U.S. Application Data

(63) Continuation of application No. 09/254,113, filed as application No. PCT/US97/15234 on Aug. 27, 1997, now Pat. No. 6,295,841.
(60) Provisional application No. 60/024,995, filed on Aug. 29, 1996.

(51) Int. Cl.[7] ..................... C03B 11/16; G05B 19/4099
(52) U.S. Cl. ................... 65/29.11; 65/DIG. 13; 65/392; 700/98; 700/157
(58) Field of Search ............... 65/29.11, 33.2, 65/DIG. 13, 392; 700/97, 98, 105, 157

(56) References Cited

U.S. PATENT DOCUMENTS

| | | | |
|---|---|---|---|
| 4,789,389 A | 12/1988 | Schermerhorn et al. | |
| 4,857,092 A | 8/1989 | Meerman | |
| 4,895,790 A | 1/1990 | Swanson et al. | |
| 4,961,767 A | 10/1990 | Schermerhorn et al. | |
| 5,086,352 A | 2/1992 | Yamagata et al. | |
| 5,161,059 A | 11/1992 | Swanson et al. | |
| 5,325,230 A | 6/1994 | Yamagata et al. | |
| 5,410,428 A | 4/1995 | Yamagata et al. | |
| 5,547,482 A | 8/1996 | Chalk et al. | |
| 5,594,651 A | * 1/1997 | St. Ville ................. | 700/98 |
| 5,616,159 A | 4/1997 | Araujo et al. | |
| 5,668,067 A | 9/1997 | Araujo et al. | |
| 5,687,094 A | * 11/1997 | Kagawa et al. ............. | 700/104 |
| 5,735,921 A | 4/1998 | Araujo et al. | |
| 6,205,818 B1 | 3/2001 | Seward, III | |

FOREIGN PATENT DOCUMENTS

| | | |
|---|---|---|
| EP | 0 483 752 A | 5/1992 |
| EP | 0 636 586 A | 2/1995 |
| WO | WO 98/07053 | 2/1998 |
| WO | WO 98/08775 | 3/1998 |

OTHER PUBLICATIONS

Allan et al., "193–nm excimer–laser–induced densification of fused silica". *Optics Letters.* 21:24, Dec. 15, 1996, 1960–1962.

Borrelli et al., "Densification of fused silica under 193–nm excitation", *J. Opt. Soc. Am. B,* 14:1606–1615, Jul. 1997.

EerNisse, E., "Compaction of ion–implanted fused silica," *J. Appl. Phys.,* 45:167–174 (1974).

Kitamura et al., "Refractive Index of Densified Silica Glass," *Journal of Non–Crystalline Solids,* NL, North Holland Physics Publishing, Amsterdam, vol. 159, No. 3, Jul. 1993, pp. 241–245.

Lillie et al., "Fine Annealing of Optical Glass" *J. Am. Cer. Soc.,* 37:466–473, 1954.

(List continued on next page.)

*Primary Examiner*—Sean Vincent
(74) *Attorney, Agent, or Firm*—Timothy M. Schaeberle; Maurice M. Klee

(57) ABSTRACT

The invention relates to fused silica having low compaction under high energy irradiation, particularly adaptable for use in photolithography applications.

16 Claims, 13 Drawing Sheets

OTHER PUBLICATIONS

Moynihan, et al., "Dependence of the fictive temperature of glass on cooling rate," *J. Am. Cer. Soc.* 59:12–16 (1976).

Norris et al., "Ionization dilatation effects in fused silica from 2 to 18–ke V electron irradiation," *J. Appl. Phys.* 45, 3876–3882 (1974).

Primak et al., "The Radiation Compaction of Vitreous silica", *J. Appl. Phys.* 39, 5651–5658 (1968).

Primak, W., "Dependence of the compaction of vitreous silica on the ionization dose," *J. Appl. Phys.* 49, 2572 (1977).

Primak, W., Section C, "Ionization Compaction," in "The compacted States of Vitreous Silica," vol. 4 of *Studies in Radiation Effects in Solids,* edited by G.J. Dienes and L.T. Chadderton (Gordon and Breach, 1975), 91–102.

Rothschild et al., "Effects of excimer laser irradiation on the transmission, index of refraction, and density of ultraviolet grade fused silica", *Appl. Phys. Lett.* 55:1276–1278 (1989).

Ruller et al., "The effect of gamma–irradiation on the density of various types of silica", *Journal of Non–Crystalline Solids,* 136:163–172, 1991.

Schenker et al., "Degradation of fused silica at 193–nm and 213–nm," *SPIE,* 2440:118–125, 1995.

Schenker et al., "Material Limitations to 193–nm Lithographic System Lifetimes," *SPIE,* 2726:698–707 (1996).

Schenker et al., "Ultraviolet–induced densification in fused silica," *J. Appl. Phys.,* 82:1065–1071, 1997.

Schenker et al., "Ultraviolet damage properties of various fused silica materials," *SPIE,* 2428:458–468 (1995).

Schermerhorn, P. "Excimer Laser Damage Testing of Optical Materials," *SPIE,* 1835:70–79, 1992.

Schroeder, "Brillouin Scattering and Pockels Coefficients in Silicate Glasses", *Journal of Non–Crystalline Solids,* 40:549–566, 1980.

Shelby, "Radiation effects in hydrogen–impregnated vitreous silica", *J. Appl. Phys.,* 50:3702–3706, 1979.

Smith et al., "193–nm excimer laser induced processes of fused silica," presented at $2^{nd}$ International Symposium on 193–nm Lithography, Colorado Springs, CO, Jul. 30–Aug. 2, 1996.

\* cited by examiner

METHOD FOR DETERMINING LASER-INDUCED COMPACTION IN FUSED SILICA

CROSS REFERENCE TO RELATED APPLICATIONS

This application is continuation of application Ser. No. 09/254,113 filed Feb. 25, 1999, now U.S. Pat. No. 6,295,841 which is the U.S. national phase under 35 USC §371 of International Application No. PCT/US97/15234 filed Aug. 27, 1997, which was published in English under PCT Article 21(2) on Mar. 5, 1998 as International Publication No. WO98/08776, which claims the benefit under 35 USC §119(e) of U.S. Provisional Application No. 60/024,995 filed Aug. 29, 1996, the contents of each of which in their entireties are hereby incorporated by reference.

FIELD OF THE INVENTION

The invention relates to fused silica having low compaction under high energy irradiation, particularly adaptable for use in photolithography applications at wavelengths of 193 and 248 nm.

BACKGROUND OF THE INVENTION

Fused silica is highly relevant to such applications as windows and mirrors used in outer space, and increasingly, it is becoming relevant to optical elements for deep ultraviolet photolithography. However, it is generally known that prolonged exposure of fused silica to intense deep ultraviolet radiation of the type utilized in photolithography leads to optical damage which is generally manifested in the form of changes in the optical and physical properties of the glass.

Laser-induced optical absorption is a commonly observed problem with fused silica. In addition to induced absorption and perhaps more importantly, there is also observed in fused silica glass a physical densification or compaction of the exposed regions of the glass when exposed to high energy irradiation. Lens elements of a stepper (for photolithographic applications) which utilize deep ultraviolet wavelengths for high resolution microcircuit fabrication may become altered due to optical modification as a consequence of prolonged exposure. Even though small changes in the optical phase front produced by the effect of exposure over the life of the lens barrel are expected, at present the maximum acceptable change is not known. What is known however, is that there is a relationship between alterations in fused silica and the ultimate effect of such changes on the wavefront. The present work is directed towards a better understanding and characterization of these relationships. Compaction or densification is most readily observed by interferometry where the alteration of the optical phase front is measured through the damaged region. Usually reported as optical path length difference, OPD, densification is measured as the product of the refractive index and the path length, in parts per million.

The question of what factors contribute to the propensity of various silica materials to optical damage when irradiated with high energy laser is not settled and several possible answers have been advanced in the literature.

In the past, it has been suggested that high OH content is desirable for low induced absorption. However, high OH fused silica is not always practical because certain applications require little or no OH, for example, waveguide applications. As a result, recently it has been suggested in co-assigned U.S. Pat. No. 5,616,159 that induced optical absorption can be significantly controlled in fused silica glass regardless of the OH content by subjecting the glass to a molecular hydrogen treatment. In that connection, it has also been disclosed in co-pending, co-assigned U.S. patent application Ser. No. 08/697,094, a low OH (less than 50 ppm) fused silica glass which is highly resistant to optical damage up to $10^7$ pulses (350 mJ/cm$^2$) at a laser wavelength of 248 nm.

In co-pending, co-assigned U.S. application Ser. No. 08/762,513, it was suggested that high purity fused silica glass having high resistance to laser-caused optical damage can also be produced by diffusing out of the glass, molecular oxygen.

More recently, in co-assigned, co-pending PCT patent application Ser. No. PCT/US97/11697, deposited Jul. 1, 1997, titled "Fused Silica Having High Resistance to Optical Damage," it was suggested that radiation-caused optical damage can be minimized or eliminated by precompacting fused silica by such processes as hot isostatic pressing and by high energy pre-exposure in order to thereby desensitize the glass to subsequent high energy irradiation during actual use.

To the best of our knowledge, until now there has been little or no discussion in the literature about the cause of the induced compaction (densification), or of how this propensity to compact can be predicted in the first instance. Accordingly, it is the object of the present invention to provide a model for predicting compaction in fused silica, as well as a method for identifying glass which will be resistant to compaction.

SUMMARY OF THE INVENTION

Briefly, the invention relates to a method for characterizing fused silica glass for use in photolithographic applications. A model is provided for predicting optical distortion of fused silica. Using the inventive model, fused silica for photolithographic applications can be selected which are characterized by the fact that the glass selected by the model undergoes little or no compaction when exposed to excimer radiation in use.

In one aspect, the invention relates to a method for producing fused silica glass stepper lens exhibiting low compaction when exposed to high intensity excimer radiation of a given dose $Nl^2$, where N is the number of pulses, and l is the fluence per pulse, said method comprising:
  (a) designing the lens by:
    (1) determining the intrinsic densification, $(\delta\rho/\rho)_p$ of a sample geometry of the fused silica;
    (2) determining the optical path difference $\delta(nl)$ of the fused silica glass at said dose; and
    (3) calculating the total densification, $(\delta\rho/\rho)$ of the fused silica glass from the values determined in steps (a)(1) and (2); and
  (b) producing the stepper lens designed in step (a).

In another aspect, the invention relates to a method for producing fused silica glass stepper lens exhibiting low compaction when exposed to high intensity excimer radiation of a given dose $Nl^2$, where N is the number of pulses, and l is the fluence per pulse, said method comprising:
  (a) designing a lens by:
    (1) selecting a sample size and geometry for the lens;
    (2) determining the intrinsic densification, $(\delta\rho/\rho)_p$ of the sample;
    (3) determining the optical path difference $\delta(nl)$ of the lens at said dose; and
    (4) calculating the total densification, $(\delta\rho/\rho)$ of the lens from the values determined in steps (a)(2) and (3); and
  (b) producing the stepper lens designed in step (a).

In a further aspect, the invention relates to a method of determining optical path damage caused by high energy irradiation in fused silica glass by:

(a) using interferometry to determine the total optical path length change δ(nl), by measuring (1) physical path change of the glass due to strain, and/or (2) change in refractive index due to any density change; and/or (b) using birefringence to map the stress distribution developed as a result of densification and using the stress measurements to characterize relative density changes across the fused silica glass.

In still another aspect, the invention relates to a method of making a fused silica stepper lens for use in a photolithographic system, said lens being resistant to laser-induced densification, and said system having a predetermined expected life at an estimated excimer laser irradiation dose, the method comprising:

(a) providing a fused silica lens blank of appropriate dimension for the photolithographic system;

(b) using a finite element elastic model, extract the intrinsic laser-induced densification, $(\delta\rho/\rho)_p$ of the blank;

(c) using interferometry, determine the optical path difference δ(nl) of the fused silica glass at said dose; and (d) calculating the expected total densification, $(\delta\rho/\rho)$ of the fused silica glass from the values determined in steps (b) and (c);

(e) producing the stepper lens by precompacting a fused silica blank using said the expected life dose to densify said blank by an amount equal to the calculated value of $(\delta\rho/\rho)$ in step (d); and (f) producing a stepper lens from the precompacted fused silica blank of step (e).

In one particular aspect, the inventive method provides a model for identifying fused silica glass having an optical path length distortion of less than 0.05 waves/cm after exposure to a high irradiation dose of $l^2N=8\times10^9$, where N is the number of pulses, and (l) is the fluence per pulse.

DETAILED DESCRIPTION OF THE INVENTION

Figure 1:
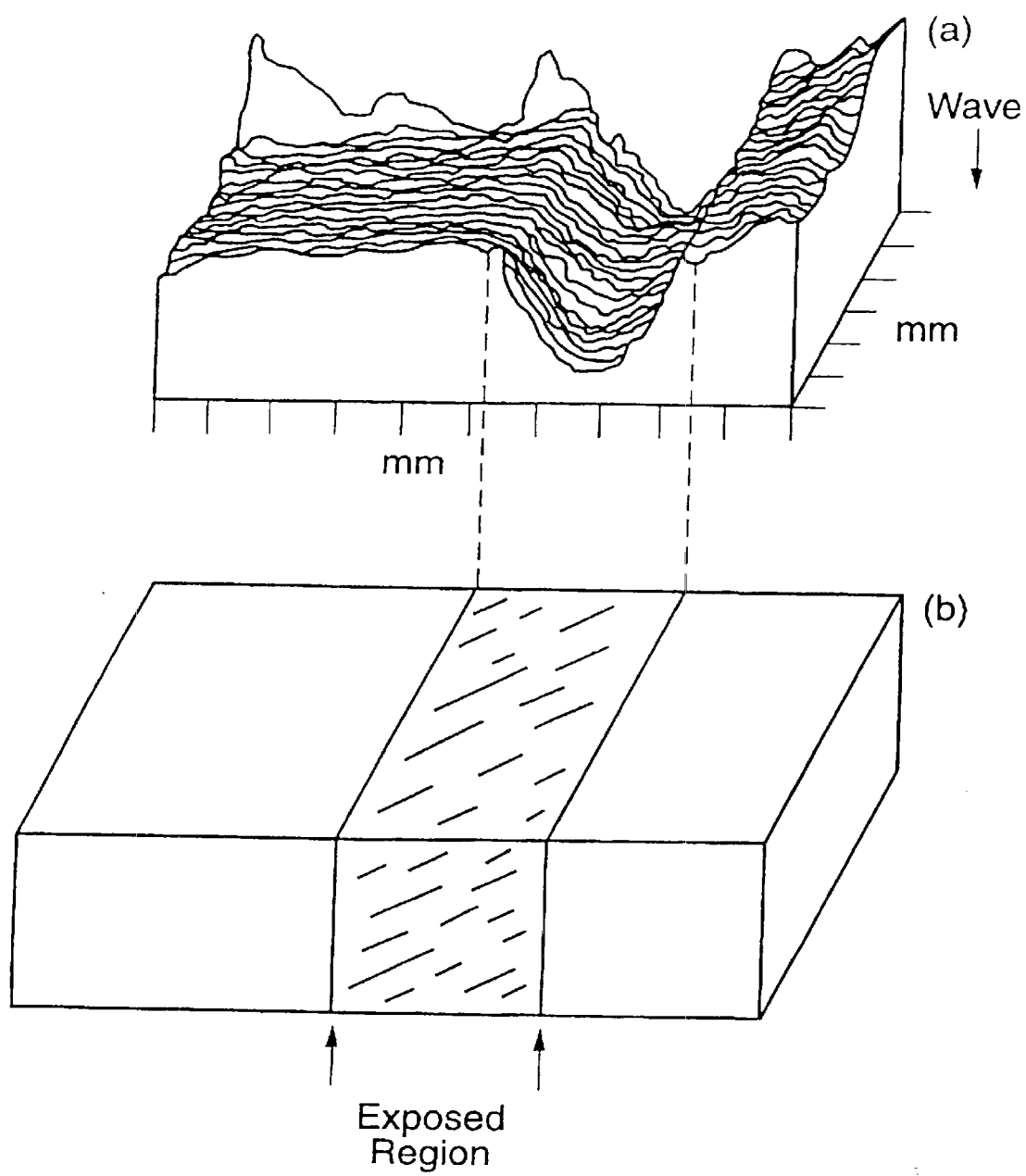
FIG. 1 represents a typical interferometer measurement perspective over the exposed region for the specific sample geometry using ZYGO Mark GPI, λ=633 nm.

Ideally, fused silica glass for photolithographic applications should be resistant to laser-induced optical damage. To be resistant to laser-induced optical damage, the glass should be resistant to laser-induced absorption and compaction. However, most fused silica glasses available today have shown a tendency to optically deteriorate after prolonged exposure to excimer laser radiation. Borrelli et al, in co-pending, co-assigned PCT application No. PCT/US97/15233, for "Silica with Low Compaction under High Energy Irradiation," deposited concurrently herewith, have demonstrated that fused silica glasses made by flame hydrolysis and sol gel methods are more resistant to laser-induced compaction than glasses made by other methods when exposed to the same laser irradiation. We have developed a model for predicting and/or estimating the optical distortion or densification of a fused silica glass.

Using the proposed model, it is now possible to select in the first instance, fused silica which will be resistant to optical distortion for photolithographic applications. Or, more importantly, by being able to predict ahead of actual use, how much a given fused silica stepper lens will compact during use, the photolithographic system can be designed to accommodate the future expected densification. Alternatively, with knowledge of expected densification, fused silica glass blanks intended for stepper lens applications may be precompacted as disclosed in co-pending, co-assigned PCT application No. PCT/US97/11697, for "Fused Silica Having High Resistance to Optical Damage," deposited Jul. 1, 1997, which is based on U.S. patent application Ser. No. 60/022,815 titled "Method of Rendering Fused Silica Resistant to Compaction," filed Jul. 26, 1996.

The form of alteration in fused silica (radiation damage), has been previously shown to depend on factors such as the crystallinity of the material, the specific type of energetic beam, as well as the accelerating potential of the beam. As stated earlier, radiation damage in fused silica glass can be manifested in two forms. The first is induced absorption which is associated with color centers produced by the exposure, and the second is a physical structural change indicated as density change. The present work is concerned with this second form—physical structural changes.

Structural change in fused silica has at least two ramifications: (1) a geometric change in the densified region, which gives rise to a decrease in the optical path length; and (2) an increase in the refractive index of the fused silica caused by an increase in density. These two effects result in a net change (increase) in the optical path length (optical path difference, OPD). The model proposed herein is capable of estimating the optical phase front distortion produced by densification for a given lens element in a stepper barrel at given intensities and exposure durations. Using the model it is then possible to design stepper lenses having predetermined densification so that the optical properties of the lens after prolonged exposure to excimer laser irradiation can be predicted in the first instance prior to installation in the photolithographic unit.

It has previously been disclosed that densification of fused silica glass when exposed to pulsed 193 nm excimer laser irradiation follows a universal function of dose, $a(NI^2)^b$, where a and b can vary according to the process by which the fused silica glass is prepared. Densification has also been shown to be initiated by a two-photon absorption process, hence the use of $I^2$. See, e.g., W. Primak and R. Kampwirth, *J. Appl. Phys.* 39, 5651–5658 (1968); W. Primak, *J. Appl. Phys.* 49, 2571 (1977); C. B. Norris and E. P. EerNisse, *J. Appl. Phys.* 45, 3876–3882 (1974); M. Rothschild, D. J. Erlich, and D. C. Shaver, *Appl. Phys. Lett.* 55, 1276–1278 (1989); P. M. Schermerhorn, *Proc. SPIE* 1835, *Excimer Lasers: Applications, Beam Delivery Systems, and Laser Design*, 70–79 (1992); R. Schenker, L. Eichner, H. Vaidya, P. Schermerhorn, D. Fladd, and W. G. Oldham, *Proc. SPIE* 2428, *Laser Induced Damage in Optical Materials*, 458–468 (1995); and R. Schenker, F. Piao, and W. G. Oldham, *Proc. SPIE* 2726, *Optical Microlithography*, 698–707 (1996).

While not intending to be bound by theory, we believe that in addition to water content, induced densification in fused silica can be caused by other factors such as the hydrogen content and thermal history of the glass. Alteration of the optical and/or physical properties of fused silica can also depend on such factors as the level of crystallinity of the glass, the type of energy beam, and the accelerating potential of the beam.

Typically, density increases caused by high energy irradiation are very small (in the range of about 1 to 50 ppm), so that direct measurements of the absolute density range can be impractical. Therefore, for the purpose of this work we used both interferometry and birefringence measurements to characterize relative density changes across fused silica samples, measuring densified (exposed) and undensified (non-exposed) regions of each sample. The induced structural damage as a function of the exposure dose was measured in two ways. As a result of the laser induced density change, the sample undergoes a change in optical path length $\delta(nl)$ and develops a stress-strain pattern. Interferometry measures the total optical path length change $\delta(nl)$. It measures both the physical path change due to strain, as well as the change in refractive index due to the density change. Birefringence, on the other hand, maps the result of the stress distribution developed as a result of the densification. In a birefringence map, the optically damaged regions are demarcated by the transition where the stress changes from tensile to compressive as indicated by the change in sign in the birefringence. We have shown that both methods are consistent and therefore represent alternative ways of measuring high energy irradiation-caused optical damage.

In the present work we demonstrate how the use of interferometry and birefringence measurements, with the aid of finite element analysis, makes it possible to obtain the laser-induced densification, independent of such factors as the sample size, geometry, irradiation pattern, and the intensity profile of the radiation beam.

For both the interferometry and birefringence measurements, we used a Lumonics Model Excimer-600 laser operating at 193 nm. The samples were 10×15×20 mm rectangles, and to better define the exposure area on the sample, the laser was directed through a rectangular aperture (5 mm in the gaussian direction and 10 mm in the constant direction, with a 15 mm path length.) The exposure pattern used in the present study is shown in FIG. 1. The beam profile was gaussian in one direction ($1/e^2$ width measured as 8.4 mm), and constant over 25 mm in the orthogonal direction. Power was monitored with a Coherent LabMaster Ultima power meter using a LM-100E thermopile detector head. Average pulse fluence was determined as the measured power through the aperture divided by the product of the aperture area and the pulse repetition rate. Typical pulse fluences were 10–50 mJ/cm$^2$.

For the interferometric measurement, we sampled the total optical path change induced by the laser in the direction shown in FIG. 1(b). A typical result is shown in FIG. 1(a). We used the peak-to-valley wavefront distortion expressed in 633 nm waves as a measure of the laser damage effect. Interferometry measurements were done with a Zygo mark GPI operating at 633 nm waves to measure the optical path change using the peak-to-valley wavefront distortion as a measure of the laser damage effect. The OPD from compaction was measured by interferometric comparison of unexposed and exposed regions of the glass so that the observed OPD depended on the particular sample geometry and illumination profile.

Since it is generally agreed that induced birefringence does not decay, the birefringence measurements were done off-line as a function of the number of pulses for distinct values of fluence per pulse using a standard null. In general, we monitored only to central point of the rectangularly-shaped damaged region shown in FIG. 1. By this method, the angular rotation to null is equal to half the phase shift induced by the birefringence. An initial null reading of the sample was taken before exposure, and the birefringence measurement was taken at the same position as a function of exposure. And in order to make a more exact comparison to the interferometric data, birefringence profile was also measured across the exposed area.

Figure 2:
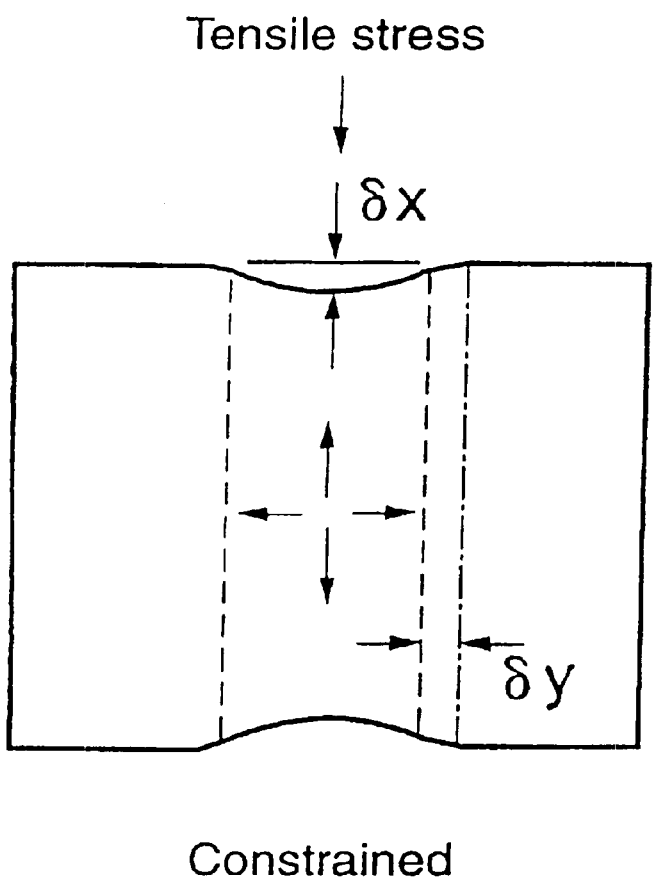
FIG. 2 is a schematic representation of the densification phenomenon as measured under actual constrained deformation.

Using a finite element model, we have successfully related interferometric and birefringence data to densification and exposure dose. After imposing an initial density change proportional to exposure dose, minimization of the elastic energy gives as a result, the final variation of strain throughout the sample, the related variation in density, and the distortions on the surface. As illustrated by FIG. 2, when a region densified by laser irradiation is allowed to relax, surrounded by undensified glass, it develops a region of tensile stress surrounded by compressive stress in the undensified region so that the surrounding glass pulls outwards on the densified glass. The constrained densification further leads to tensile and compressive stresses in the body of the glass, all of which can be detected and measured through their associated birefringences using polarimetry.

Generally, following the line of maximum fluence through the sample, the final density is observed to be greatest near the surface where there is least constraint from surrounding glass, and the final density is least near the center of the sample. In the elastic model solution, the relationship between illumination, densification, wavefront distortion and birefringence are dependent on such factors as sample size, shape and pattern of illumination.

In the following sections, we demonstrate the model using finite element analysis and by applying the relationships and formulae described in Borrelli, Smith, Allan and Seward. "Densification of fused silica under 193-nm excitation", J. Opt. Soc. Am. B/Vol. 14, No. 7/July 1997, 1606, and Allan, Smith, Borrelli, and Seward, "193-nm excimer-laser-induced densification of fused silica", OPTICS LETTERS/ Vol. 21, No. 24/Dec. 15, 1996, 1960, (herein incorporated by reference).

Finite-element Analysis

Figure 3A:
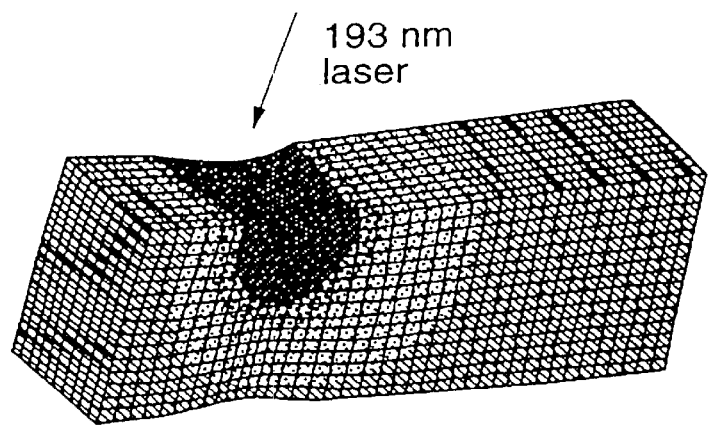
FIG. 3 is a representative finite element model showing (a) contours of iso-strain, displayed on finite element grid, showing displacement perpendicular to laser-exposed surface, (b) computed wavefront distortion (633 nm waves) computed across the altered or damaged region of the sample, and (c) birefringence angle θ, computed across the altered or damaged region, all at input densification δρ/ρ of $20\times10^{-6}$.
Figure 3B:
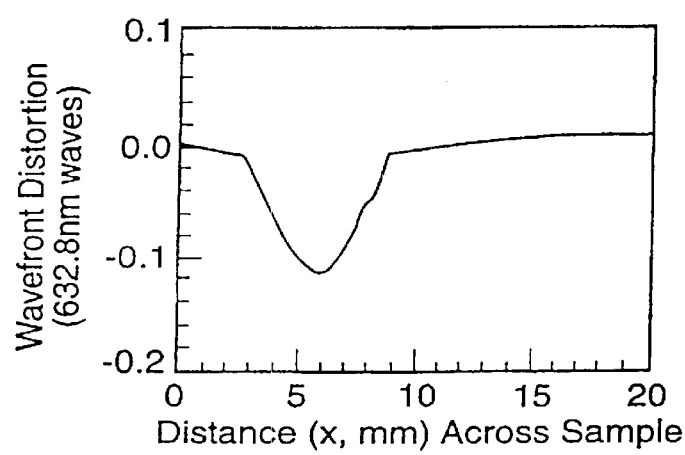
Figure 3C:
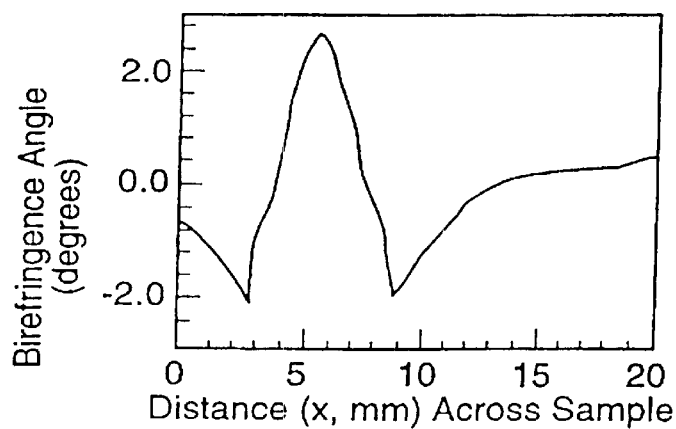

To simulate densification in the finite element model, we began with an initial state of strain in which densification is a function of the laser beam intensity. The model is then allowed to relax to its equilibrium state, minimizing the elastic energy subject to zero stresses normal to surfaces, and from this, we calculated the sample deformation and stress distribution. In FIG. 3(a) we show an illustrative sample deformation and contours of strain on the surface of the sample. Surface strains normal to surfaces can be directly measured by reflection interferometry. The strains resulting from elastic relaxation allow calculation of density while stress variations allow calculation of optical path differences (wavefront distortion) and birefringence as shown in FIGS. 3(b) and 3(c).

Figure 4A:
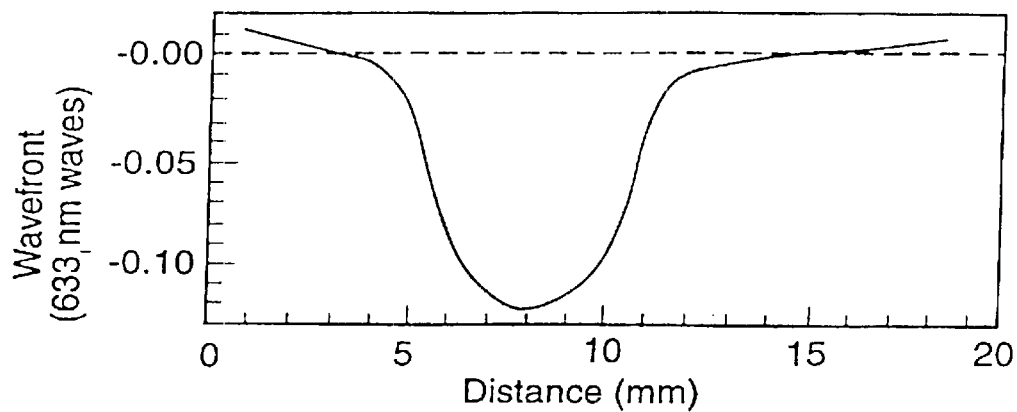
FIG. 4(a) is a typical measured wavefront distortion for transmission through damaged sample in the direction of the laser, and 4(b), a map of birefringence angle through the same region of the sample.
Figure 4B:
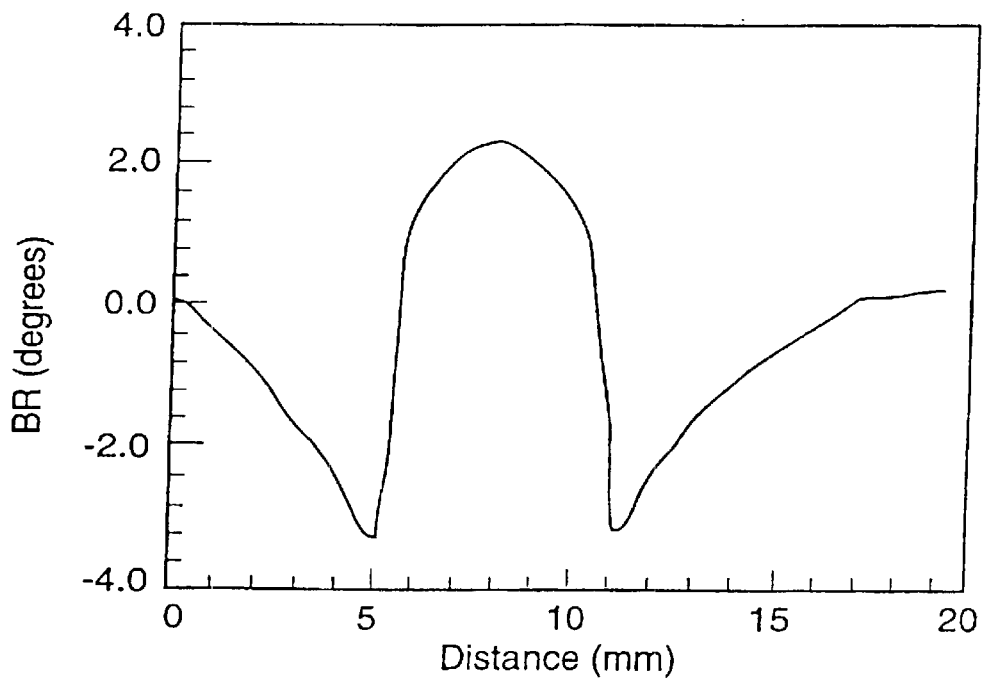
Figure 5A:
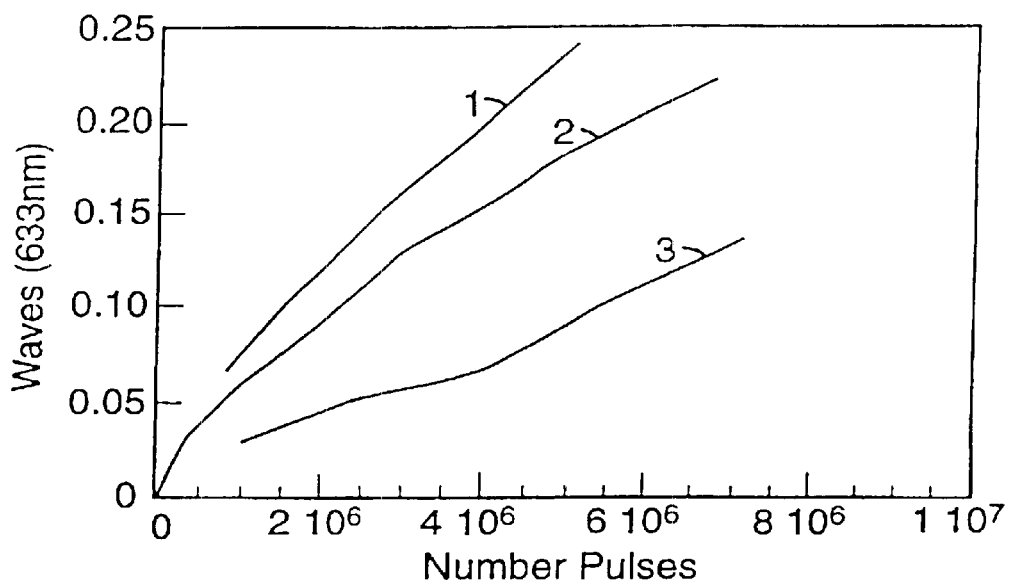
FIG. 5(a) is a plot of wavefront distortion (waves at 633 nm)-vs-number of pulses N at three values of fluence per pulse, and 5(b) measured birefringence versus number of pulses at the same three fluences in mJ/cm², namely, 43 (line 1), 32 (line 2) and 21 (line 3)
Figure 5B:
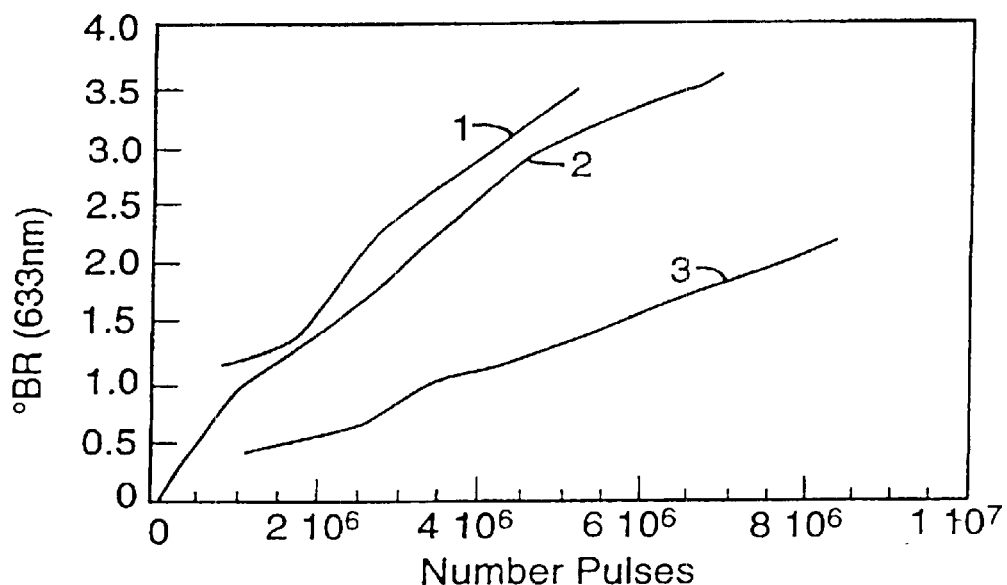
Figure 6:
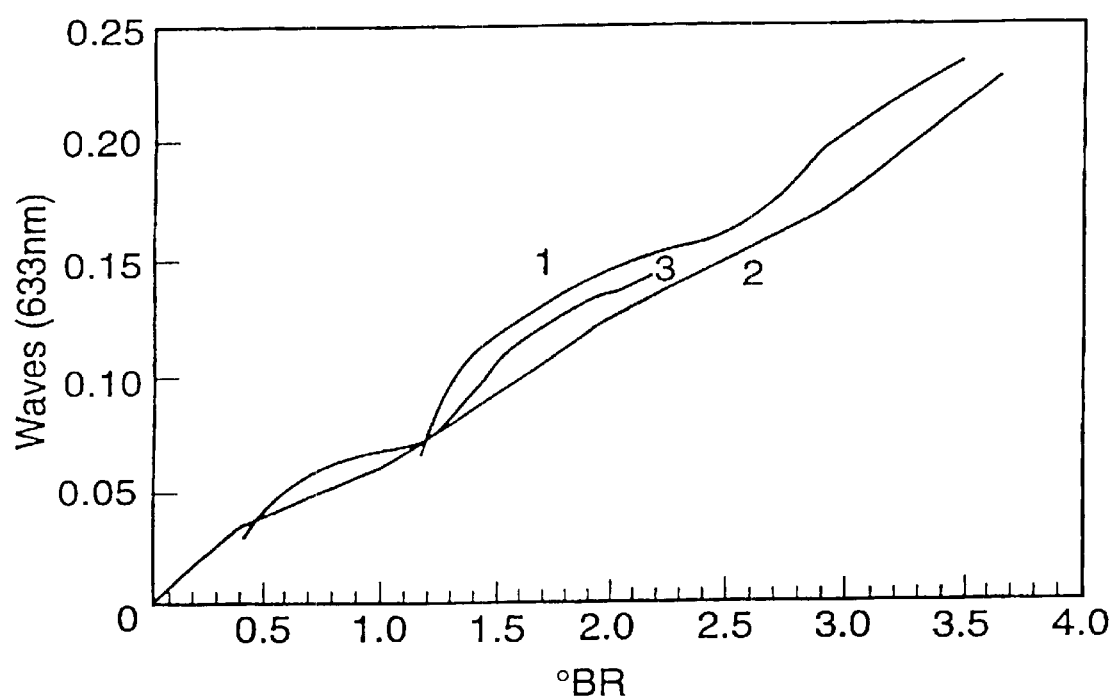
FIG. 6 represents wavefront distortion (waves at 633 nm)-vs-birefringence angle for the data presented in FIGS. 5(a) and 5(b)

A typical 193 nm laser-induced densification pattern for a Corning HPFS® fused silica glass sample (available from Corning Incorporated, Corning, N.Y.) using the exposure pattern of FIG. 1 is indicated by the interferometric and birefringence measurements shown in FIGS. 4(a) and 4(b). The total phase change, expressed in 633 nm waves is measured across the damaged region. The negative sign to the distortion in FIG. 4(a) indicates a retardance of the wavefront. For comparison, a scan of birefringence through the same damaged region is shown in FIG. 4(b). The change in sign of the birefringence at the boundary between exposed and unexposed regions corresponds to a change from tensile stress to compressive stress. The evolution of the wavefront distortion as a function of pulse fluence for a given sample, and the corresponding birefringence are shown in FIGS. 5(a) and 5(b), respectively for three pulse fluences in mJ/cm²: 43 (line 1), 32 (line 2), and 21 (line 3). The quantitative relationship between the wave front distortion and the birefringence (at the same fluences) is shown in FIG. 6.

Birefringence vs. Interferometric measurements

Figure 7A:
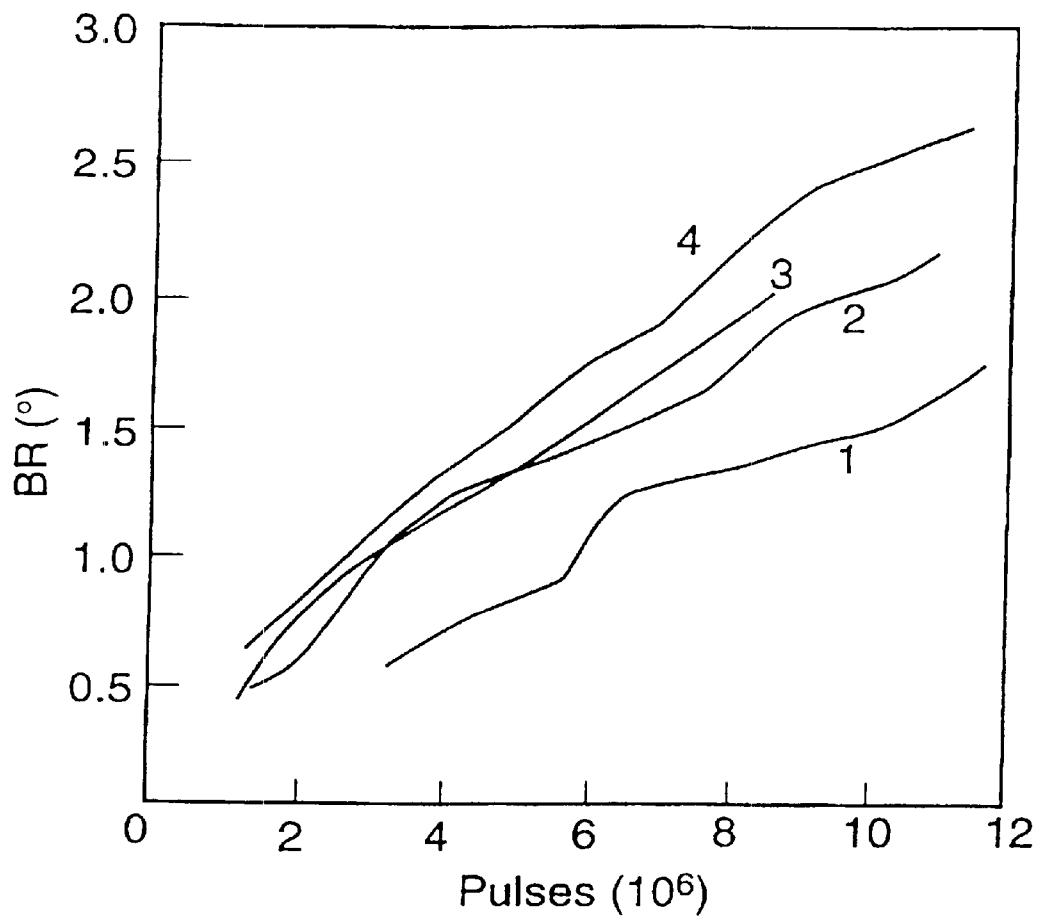
FIG. 7(a) is birefringence-vs-number of pulses at 25 mJ/cm² for a sample that has had the following thermal treatments before exposure: unannealed (line 1), boule annealed (line 2), from 1200° C. at 10° C. per hour (line 3), and 1000° C. air quenched (line 4)
Figure 7B:
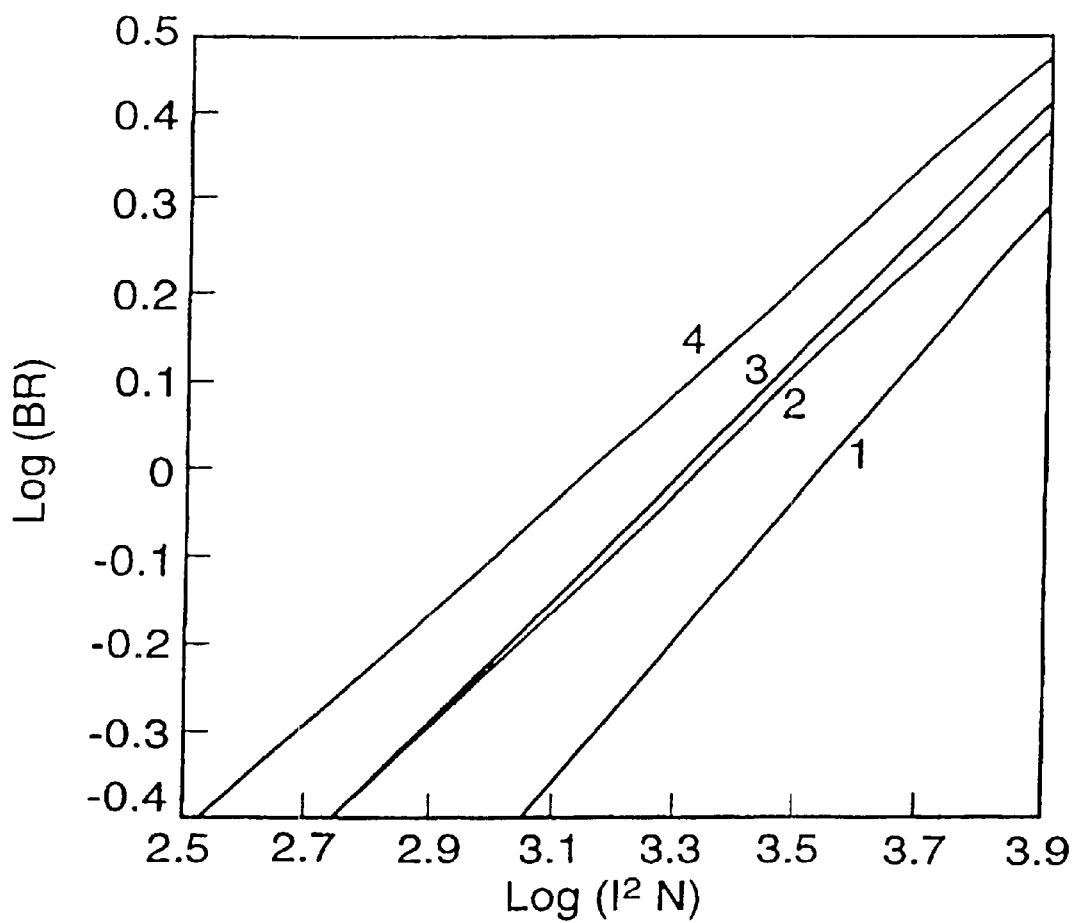
FIG. 7(b) represents the same data as FIG. 7(a) plotted as log birefringence-vs-log of number of pulses times the square of the pulse fluence.
Figure 8:
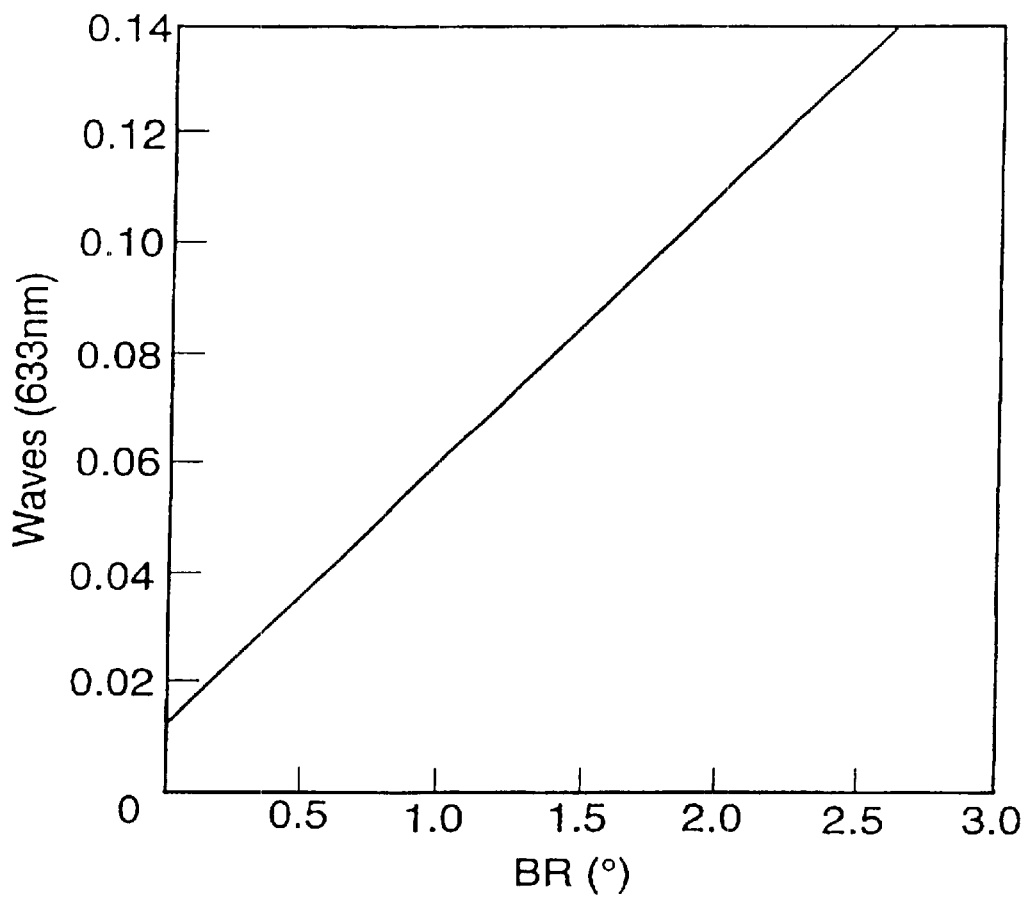
FIG. 8 is a correlation of the measured birefringence with the interferometrically measured wavefront for all the data points of FIG. 7.

To ascertain to what extent the differences observed in FIG. 5 and other studied samples may be due to differences in the thermal history of the samples, in the following examples, we studied the variations in densification behavior as a function of thermal treatment for four different samples taken from the same position in the boule. The four thermal treatments were: (1) unannealed, (2) boule annealed, (3) sample annealed from 1200° C. at 10° C./hour, and (4) sample air quenched from 1000° C. The densification, as measured by the birefringence as a function of number of pulses for the four samples is shown in FIG. 7(a). The birefringence as a function of the quantity I²N on a log/log plot is shown in FIG. 7(b), while the composite correlation of birefringence and measured wavefront distortion is shown in FIG. 8 for the four samples.

The interferometric data which measure the optical path length change $\delta(nl)$ (and consequently, both the physical path change due to strain as well as the change in refractive index due to the density change), indicate that the net effect is a retardation so that the index change caused by densification dominates. On the other hand, the birefringence map represents the result of the stress distribution developed as a consequence of the densification. As shown in FIG. 6, the measured values of the phase shift and the birefringence are linearly correlated indicating that the two approaches are consistent and represent alternative methods for measuring densification which can be used interchangeably to determine laser induced densification using the finite element elastic model.

The conversion from wavefront distortion or birefringence to input densification for the sample configuration are given by the following two relationships:

$$\delta(nl) \text{ (waves at 633 nm)} = 0.00587 \, (\delta\rho/\rho)_p \text{ (ppm)} \quad (1)$$

and $$\text{Birefringence (°) at 633 nm} = 0.114 \, (\delta\rho/\rho)_p \text{ (ppm)} \quad (2).$$

From the above equations, we extract the intrinsic laser induced densification, $(\delta\rho/\rho)_p$, independent of the geometry of the sample. From $(\delta\rho/\rho)_p$ we then predict the phase front deformation for a given geometry.

Effect of (I²N) on Densification

Figure 9:
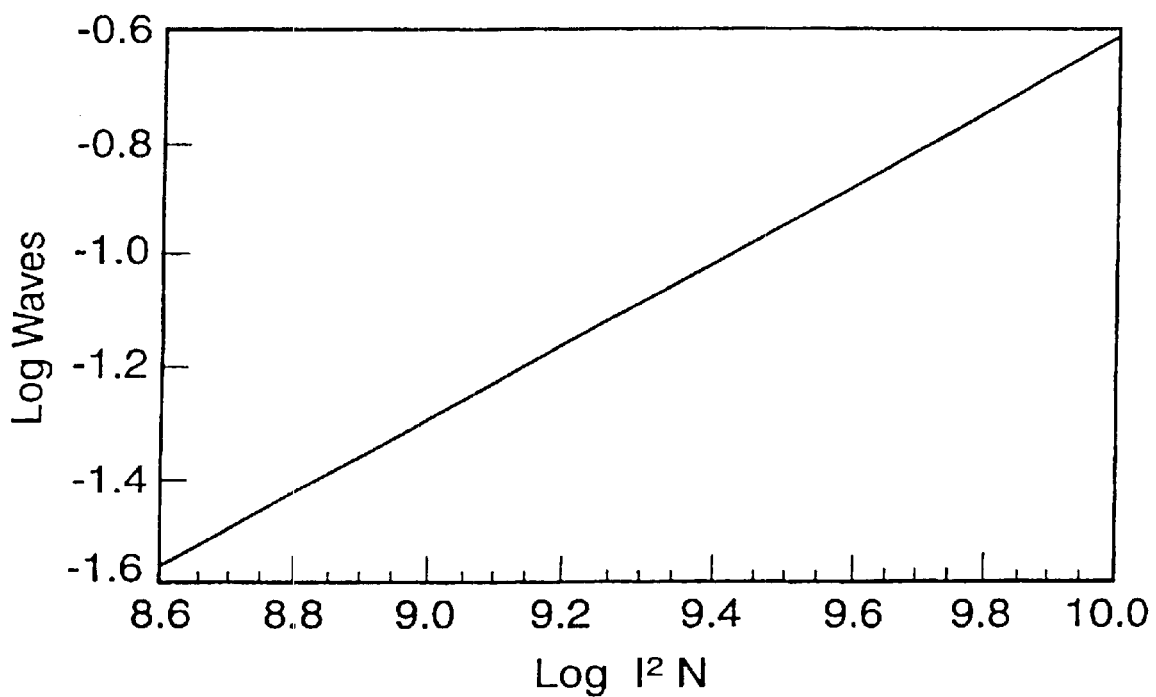
FIG. 9 is a wavefront distortion data from FIG. 5(a) plotted on a log/log scale.

In FIG. 9, we show data for a series of samples exposed at various levels of pulse fluence, plotting the log(OPD, 633 nm waves)-vs-log(NI², pulses×(mJ/cm²)²) for number of pulses, N, and pulse fluences, l, in mJ/cm² of: 20 (diamonds), 32 (circles) and 43 (squares). As shown, OPD values for exposures of various pulse fluence lie generally along the same smooth curve, demonstrating reciprocity, i.e., glass densification depends on NI², but not separately on N and l. All data lie close to a single curve with a slope, b, of about 0.70.

For a large sample size, we have observed this slope to generally lie in the range of 0.5 to 0.7, indicating possible sample variations and some measurement error. Such variations notwithstanding, since densification involves a structural rearrangement of the glass network, it is important to understand the effect of the initial glass structure on the subsequent densification. One convenient characterization of the initial structure is the fictive temperature imposed by the thermal treatment by which the glass is produced as illustrated by FIGS. 7(a) and 7(b), and the accompanying text. Even though the lines for each thermal treatment are separate and have slightly different slopes, the results do show the significance of thermal history.

The power law behavior represents densification as a relaxation process of the form referred to as a stretched exponential function, namely $$\frac{(\rho - \rho_o)}{(\rho_{eq} - \rho_o)} = 1 - \exp\left(-(NI^2)^b\right), \quad (3)$$

where $\rho_{eq}$ is an equilibrium value of density which would be reached after very large dose, and $\rho_o$ is the initial density at zero dose. At small dose, NI², equation (3) reduces to $(\rho-\rho_o)=a\times(NI^2)^b$ with $a=(\rho_{eq}-\rho_o)$.

Effect of Sample Variations (geometry) on predicted densification

Figure 10:
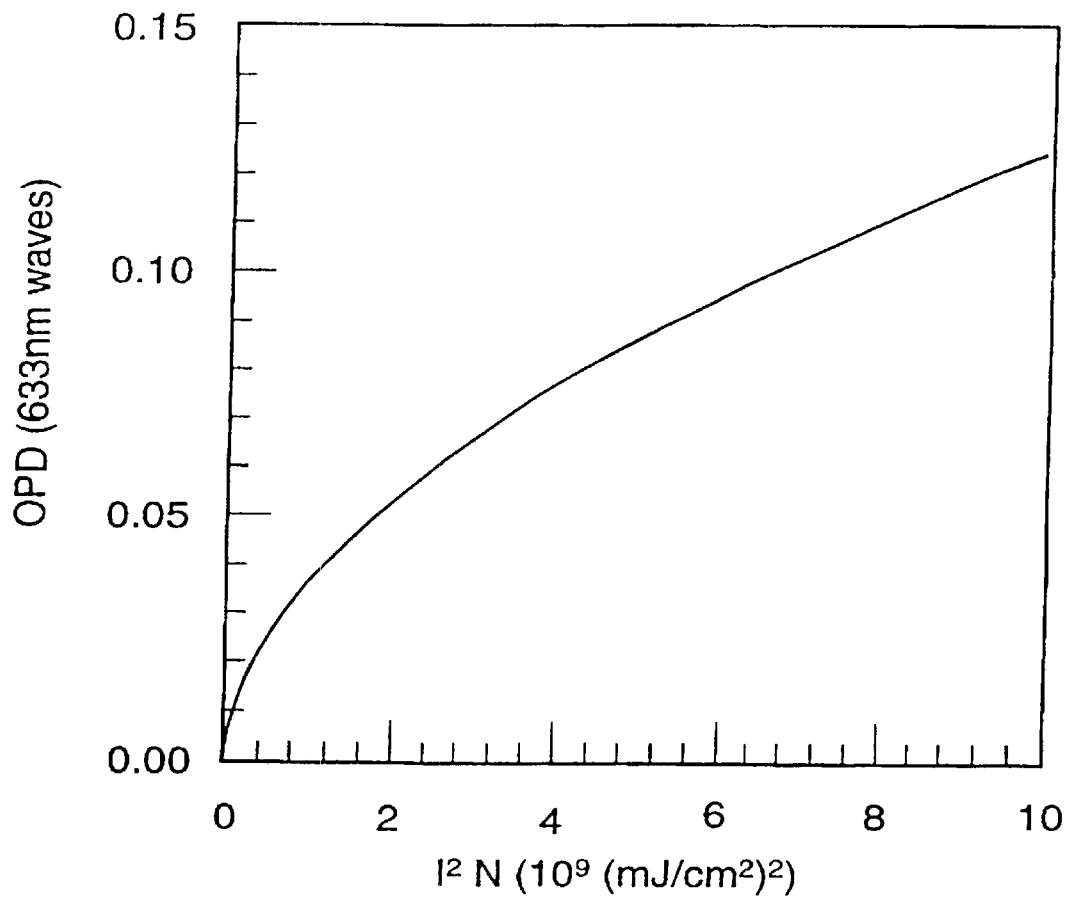
FIG. 10 is a graph of optical path difference-vs-dosage for a single sample exposed at multiple pulse fluence values.

In the following section, to avoid any effects due to sample to sample variation, in FIG. 10 (OPD-vs-NI²), we display data for a single Corning HPFS® fused silica glass sample exposed at the same spot with three different values of pulse fluence (in mJ/cm²), namely, 21, 32, and 27.

To predict the induced OPD in any arbitrary sample geometry and radiation profile, we used a finite element elastic model from which we extracted the intrinsic laser-induced densification $(\delta\rho/\rho)_p$ the glass would have undergone in the absence of the surrounding unirradiated (undensified) glass which constrains its movement. For the sample geometry used, the value of $(\delta\rho/\rho)_p$ for the sample was determined to be 170 ppm×measured OPD (633 nm waves). This value, $(\delta\rho/\rho)_p$, can now be used to calculate the OPD of any sample which is exposed to the same dose and having the same exposure profile. This is illustrated in following section.

Laser-induced densification vs. Phase-front distortion

In the following example, we estimate or predict the phase front distortion within a typical stepper lens resulting from prolonged 193 nm exposure in order to determine the relationship between laser-induced densification and the resulting phase front distortion. For this purpose we make the assumption that the desired life of a stepper lens is 10 years, which translates to 10 billion pulses of exposure. We have also assumed an exposure fluence of about 0.5 mJ/cm²/pulse. Another consideration for the following calculation is the stepper sequence of the lens. For our calculation, we selected the lens nearest the wafer plane where illumination is expected to be intense, and where the intensity profile is assumed to be flat. The assumed lens and exposure pattern for this example are depicted by FIGS. 11(a) to 11(c).

Figure 12:
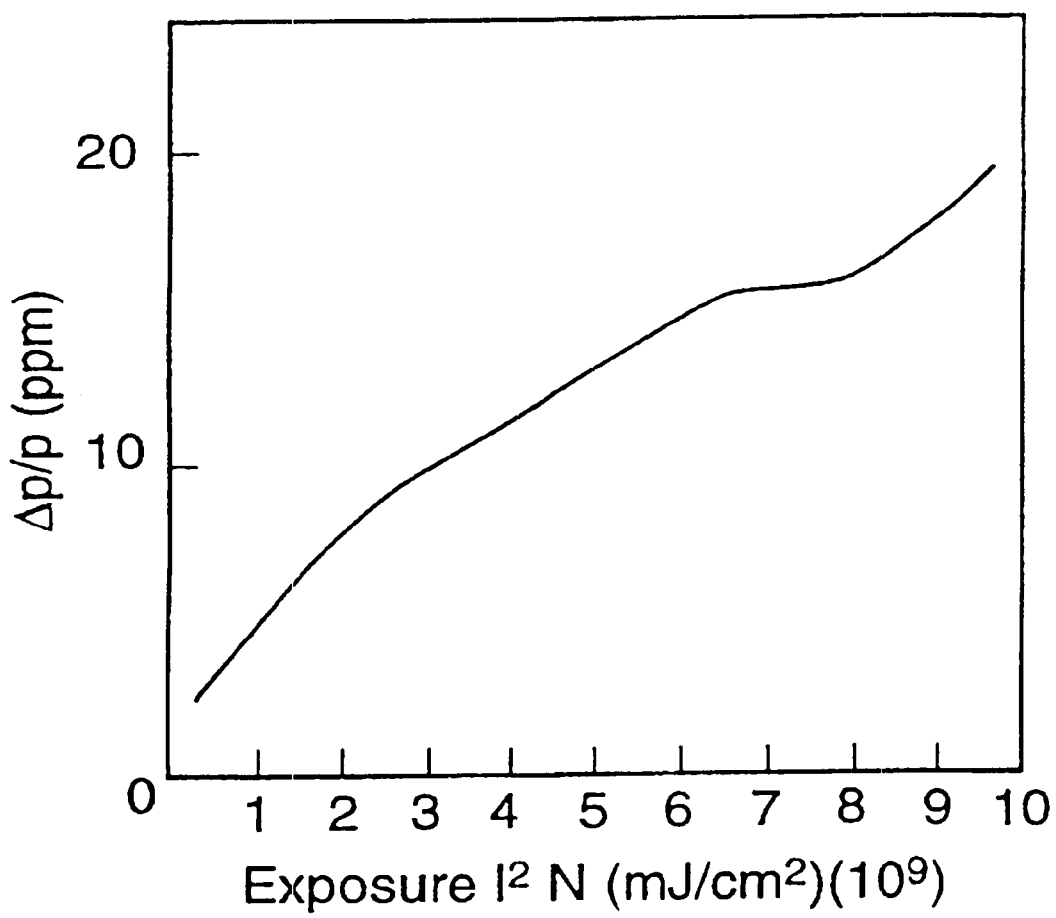
FIG. 12 is the calculated $\delta\rho/\rho$-vs-$l^2N$ for representative HPFS® fused silica glass available from Corning Incorporated, Corning, N.Y.

Using the inventive model, the OPD for a plano lens element of dimensions 13.3 mm (thick)×25 mm (radius) was calculated for a 10 year life at 1 billion pulses per year (or a total of $10^{10}$ pulses), irradiated at a pulse fluence of 0.5 mJ/cm² to obtain a dose, NI², of $2.5 \times 10^9$ (mJ/cm²)²×pulse, reflecting what one would expect to find in use in a photolithographic stepper lens. From the experimental data for a typical HPFS® sample (FIG. 10), we obtained an estimate of the value of $(\delta\rho/\rho)_p$ by using a finite element model analysis to establish the value of $(\delta\rho/\rho)_p$ that would correspond to the measured wavefront distortion for the sample geometry (determined above to be 170 ppm). From this we were then able to obtain a plot of $(\delta\rho/\rho)_p$ vs. $I^2N$ as shown in FIG. 12. At a dose of $2.5 \times 10^9$ in FIG. 12, we obtain a $(\delta\rho/\rho)_p$ of 9.9 ppm. The expected OPD at this dose for the above standard exposure geometry can also be determined from FIG. 10 to be 0.058 waves at 633 nm. The resulting value for $\delta\rho/\rho$ is thus 170×0.058 or 9.9 ppm.

Figure 11A:
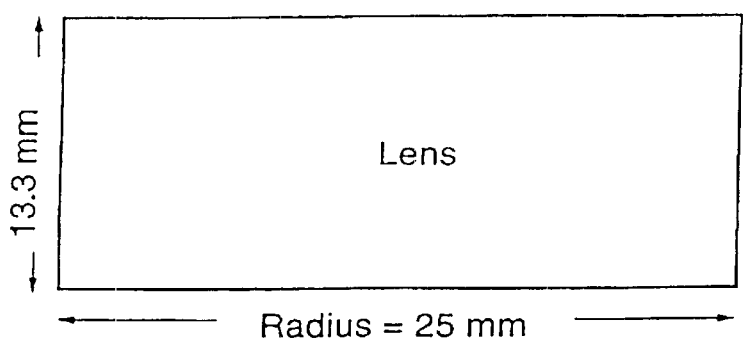
FIG. 11 is an estimate of the wavefront distortion under 10 years life condition for (a) stepper lens geometry, (b) exposure pattern, and (c) computed variation δ(nl)
Figure 11B:
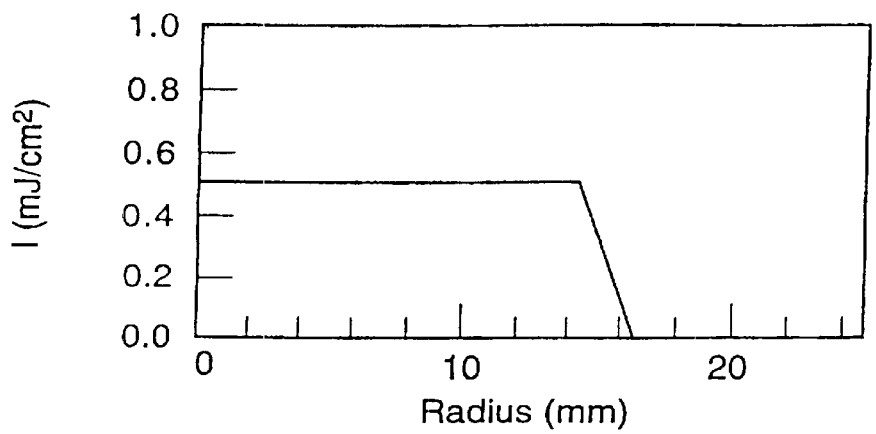
Figure 11C:
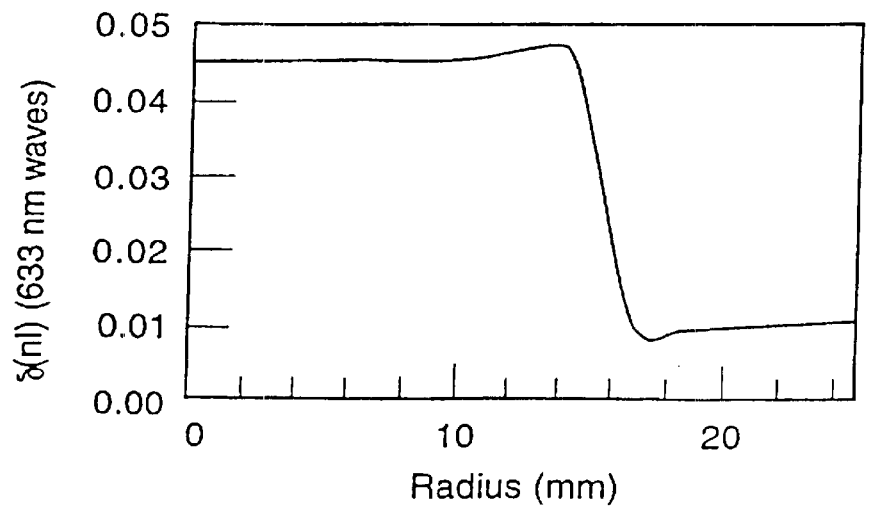

As shown in FIGS. 11(a) to 11(c), the maximum increase in $\delta(nl)$ over the entire profile of the lens is 0.047 waves at 633 nm, which corresponds to a $\delta(nl)$ of 0.155 waves at 193 nm, ignoring dispersion which is expected to be small. FIG. 11(a) represents the tested stepper lens geometry, 11(b) the exposure pattern, and 11(c) the optical path difference in 633 nm waves. Unlike the values reported by Schenker et al., which are based on observed birefringence and a plane strain elastic model which does not take into account the effects of geometry and surface deformation, the present model includes direct measurements of $\delta(nl)$ by interferometry and a realistic elastic model which takes into account, sample geometry, irradiance and the effects of surface distortions.

What is claimed is:

1. A method for predicting the optical path distortion of a fused silica glass lens under actual photolithographic use conditions comprising:
   (a) determining the intrinsic densification of said fused silica glass for a given number of pulses and a given pulse fluence; and
   (b) predicting the optical path distortion of said lens for said given number of pulses and given pulse fluence using said intrinsic densification.

2. The method of claim 1 wherein step (a) comprises:
   (i) irradiating a sample of said fused silica glass with said given number of pulses and said given pulse fluence, said sample having a predetermined geometry and said pulses having a predetermined profile;
   (ii) measuring at least one of:
      (a) a change in optical path length as a result of the irradiation for at least one path through the sample, or
      (b) a change in birefringence as a result of the irradiation for at least one path through the sample; and
   (iii) determining the intrinsic densification from the measurements of step (ii) and a model of the response of a sample having the predetermined geometry to a pulse having the predetermined profile.

3. The method of claim 2 wherein the model is a finite-element model.

4. The method of claim 1 wherein step (b) is performed using a model for said lens.

5. The method of claim 4 wherein said model is a finite-element model.

6. A method for parameterizing the response of a fused silica glass of a specified type to laser light of a specified dose comprising:
   (a) selecting a geometry for a sample of the glass;
   (b) selecting a laser beam profile for irradiating the sample with the specified dose;
   (c) irradiating a sample of the glass having the geometry selected in step (a) with a laser beam having the specified dose and the profile selected in step (b) and measuring at least one of:
      (i) a change in optical path length as a result of the irradiation for at least one path through the sample, or
      (ii) a change in birefringence as a result of the irradiation for at least one path through the sample;
   (d) modeling the response of a sample having the geometry selected in step (a) to a laser beam having the profile selected in step (b); and
   (e) determining an intrinsic densification value for the glass from the at least one measurement of step (c) and the modeling of step (d), said value being a parameter which characterizes the response of the glass to laser light having the specified dose.

7. The method of claim 6 wherein step (d) is performed using finite-element analysis.

8. A method for producing a stepper lens for use in a photolithographic system, said stepper lens being composed of a specified type of fused silica, said method comprising:
   (a) determining an intrinsic densification value for the specified type of fused silica;
   (b) designing the stepper lens to have a predicted lifetime densification using said intrinsic densification value of step (a); and
   (c) producing the stepper lens designed in step (b).

9. The method of claim 8 wherein step (a) comprises:
   (i) irradiating a sample of said specified type of fused silica with a dose of laser light having a predetermined profile;
   (ii) measuring at least one of:
      (a) a change in optical path length as a result of the irradiation for at least one path through the sample, or
      (b) a change in birefringence as a result of the irradiation for at least one path through the sample; and (iii) determining the intrinsic densification from the measurements of step (ii) and a model of the response of a sample having the predetermined geometry to laser light having the predetermined profile.

10. The method of claim 9 wherein the dose is the expected lifetime exposure of the stepper lens to laser light in the photolithographic system.

11. The method of claim 9 wherein the model is a finite-element model.

12. The method of claim 8 wherein step (b) is performed using a model for said stepper lens.

13. The method claim 12 wherein said model is a finite-element model.

14. The method of claim 1 wherein in step (a), a programmed computer is employed in determining the intrinsic densification of said fused silica glass.

15. The method of claim 6 wherein a programmed computer is employed in the modeling of step (d).

16. The method of claim 8 wherein in step (a), a programmed computer is employed in determining the intrinsic densification value for the specified type of fused silica.

* * * * *